United States Patent [19]

Ma et al.

[11] Patent Number: 6,013,418
[45] Date of Patent: Jan. 11, 2000

[54] METHOD FOR DEVELOPING IMAGES IN ENERGY SENSITIVE MATERIALS

[75] Inventors: Yi Ma, Orlando, Fla.; Timothy William Weidman, Sunnyvale, Calif.

[73] Assignee: Lucent Technologies Inc., Murray Hill, N.J.

[21] Appl. No.: 08/799,312

[22] Filed: Feb. 14, 1997

Related U.S. Application Data

[63] Continuation-in-part of application No. 08/201,823, Feb. 25, 1994, Pat. No. 5,635,338, which is a continuation-in-part of application No. 07/875,851, Apr. 29, 1992, Pat. No. 5,439,780
[60] Provisional application No. 60/025,926, Sep. 11, 1996.
[51] Int. Cl.$^7$ ........................................................ G03F 7/26
[52] U.S. Cl. .............................. 430/323; 430/325; 216/62
[58] Field of Search .................................... 430/311, 313, 430/323, 325, 330; 156/628.1, 646.1, 659.11; 216/62

[56] References Cited

U.S. PATENT DOCUMENTS

| | | | |
|---|---|---|---|
| 4,904,338 | 2/1990 | Kozicki | 156/628 |
| 4,921,321 | 5/1990 | Weidman | 350/96.12 |
| 5,439,780 | 8/1995 | Joshi et al. | 430/296 |
| 5,635,338 | 6/1997 | Joshi | 430/325 |

OTHER PUBLICATIONS

"Plasma–Deposited Organosilicon Thin Films as Dry Resists For Deep Ultraviolet", by Horn, M. W. et al., *J. Vac. Sci. Technol.* B 8(6), pp. 1493–1496, (Nov./Dec. 1990).

"Vapor Phoase $SiO_2$ Etching and Metallic Contamination Removal in an Integrated Cluster System", by Ma, Y. et al., *J. Sci. Technol.,* B 13(4), pp. 1460–1465, (Jul./Aug. 1995).

"Etching of Thermal Oxides in Low Pressure Anhydrous $HF/CH_3OH$ Gas Mixture at Elevated Temperature", by Ruzyllo, J. et al., *J. Electrochem. Soc.* Vol. 140, No. 4, pp. L64–L66, (Apr. 1993).

"All Dry Lithography: Applications of Plasma Polymerized Methylsilane as a Single Layer Resist and Silicon Dioxide Precursor", by Weidman, T. W. et al., *Journal of Photopolymer Science and Technology*, vol. 8, No. 4, pp. 679–686, (1995).

*Primary Examiner*—Kathleen Duda
*Attorney, Agent, or Firm*—Richard J. Botos

[57] ABSTRACT

A lithographic process for device fabrication is disclosed in which a hydrogen fluoride vapor is used to develop a pattern from an image introduced into an energy sensitive resist material. A class of silicon-containing materials display excellent sensitivity in the ultraviolet and deep ultraviolet for the formation of patterns by radiation induced conversion into glassy compounds. When these materials are patternwise exposed to radiation in the presence of oxygen, the oxygen content of the unexposed region is significantly different from the oxygen content in the exposed region. The pattern is developed using HF because the higher oxygen content material is etched at a faster rate by HF than the lower oxygen content material. Materials are deposited from the vapor phase and show excellent promise for use as resists in the fabrication of electronic and optical devices.

12 Claims, 3 Drawing Sheets

METHOD FOR DEVELOPING IMAGES IN ENERGY SENSITIVE MATERIALS

CROSS-REFERENCE TO RELATED APPLICATION

This application is a continuation-in-part of copending U.S. patent application Ser. No. 08/201,823, filed Feb. 25, 1994, now U.S. Pat. No. 5,635,338 which is a continuation-in-part of U.S. Ser. No. 07/875,851, filed Apr. 29, 1992, now U.S. Pat. No. 5,439,780 which are hereby incorporated by reference. This application also claims priority of Provisional Application No. 60/025,926 filed Sept. 11, 1996.

1. FIELD OF THE INVENTION

This invention relates to photosensitive materials and, in particular, to a method of developing photosensitive materials including silicon atoms.

2. ART BACKGROUND

Photosensitivity has been found in polymers having an all silicon backbone such as in A) linear poly (diorganosilylenes), sometimes called polysilylenes or polysilanes, i.e., materials having the general formula $[R^1R^2Si]_n$ with $R^1$ and $R^2$ being various alkyl or aryl substituents and having n typically larger than 20, and B) in polysilyne network materials, i.e., materials having at least 70% of their silicon atoms bound to only one organic substituent and to three other silicon atoms.

Irradiation of linear polysilylenes with UV or deep UV light generally causes fragmentation that results after development in positive images—the unexposed regions remain after development. The photoreactivity of polysilynes is markedly different from that of polysilylenes. The polysilyne layer is exposed to ultraviolet light in the presence of oxygen to induce photooxidation with formation of crosslinked Si—O—Si networks. Such photooxidation produces changes in chemical behavior, solubility, and in the refractive index of the oxidized relative to the unoxidized regions. The photooxidation allows selective removal by suitable solvents or halogen-based plasma reactive ion etching of the unexposed region to produce a negative image. Thus, photooxidation processes in polysilynes are suitable for fabrication of optical and electronic devices. (See U.S. Pat. No. 4,921,321, dated May 1, 1991.)

Organosilicon films of partially characterized structure (reported in M. W. Horn et al, *Journal of Vacuum Science and Technology*, B8, 1493 (1990), that contain substantial Si—C—Si backbone bonds and an insignificant presence of Si—(Si)—Si bonds), have been deposited by plasma reaction of various volatile organosilicon compounds such as tetramethylsilane. These materials show a decrease in solubility and increased resistance to gaseous HBr or chlorine plasma etching after exposure to light at 193 nm with sensitivities of approximately 50 $mJcm^{-2}$, but are essentially transparent and not useful at longer wavelengths such as at 248 nm. For many processes such as the formation of electronic and optical devices, photosensitive materials (denominated resists) having a photosensitivity better than 200 $mJcm^{-2}$ and preferably better than 100 $mJcm^{-2}$ at or above 248 nm are required to avoid undesirably long exposure times. (Photosensitivity is defined as exposure dose required to allow the development of an imaged film capable of functioning as an effective etch mask for subsequent pattern transfer by reactive ion etching.)

Silicon polymers deposited from a gas phase are described in U.S. Pat. No. 5,439,780 to Joshi et al. These polymers, formed from precursors such as methylsilane, ethylsilane, and phenylsilane, provide a substantial bonded network of Si—$(Si)_n$—Si which is sensitive to light at wavelengths in the ultraviolet (UV) and deep UV range. When these polymers are exposed to radiation at these wavelengths in the presence of oxygen, a siloxane network forms in the exposed regions selectively. In this manner, a selectivity is introduced into the exposed resist which is exploited to develop the image of the pattern in the resist.

However, Joshi et al. utilize aqueous hydrofluoric (HF) acid as a developer for positive-tone resists. Although patterns can be developed using an aqueous HF etchant, there is a possibility that particles of resist will remain on the substrate in the areas from which the resist was intended to be removed. The presence of these particles adversely affects the subsequent transfer of the developed pattern into the underlying substrate. Accordingly, methods of development less susceptible to leaving particle residues which are also compatible with the cluster tool are desired. One advantage of polymers deposited from the gas phase is that resist formation, exposure, development, and pattern transfer are possible within an interconnected series of chambers (sometimes referred to as a cluster tool ).

It has long been a goal to form a suitable resist on a substrate by deposition from the gas phase, useful for conventional deep to mid-UV photolithography (for example, at 193, 248, 310, or 365 nm). Such gas phase deposition is advantageous since resist formation, exposure, development, and pattern transfer would become possible within an interconnected series of chambers (sometimes called a cluster tool) without degradation resulting from exposing the wafer to the ambient. In this regard, a process for developing a positive tone pattern in such resists that is compatible with the cluster tool is also desired.

SUMMARY OF THE INVENTION

The process of the present invention is directed to a vapor development process that is particularly useful for developing positive-tone patterns in silicon-containing energy sensitive resist materials. In the process of the present invention, a silicon-containing energy sensitive resist material which contains an image of a pattern delineated by selective exposure of the resist material to radiation is exposed to hydrogen fluoride (HF) vapor. The basis for the selectivity between the exposed portions of the resist and the unexposed portion of the resist is the relative concentration of silicon (Si) bonded to oxygen (O) in the exposed and unexposed portions of the energy sensitive material. The greater the difference in concentration between the Si—O bonds in the unexposed resist relative to the concentration of the Si—O bond in the exposed resist, the greater the etch selectivity between the unexposed portions of the resist and the exposed portions of the resist.

In the process of the present invention, a film of energy sensitive resist material is formed on the substrate. An image of a pattern is delineated in the energy sensitive resist material via a patternwise exposure to radiation. This exposure is done in the presence of oxygen and, as a result, substantially more oxygen reacts with silicon to form Si—O bonds in the exposed portion of the resist than in the unexposed portion of the resist.

After exposure, the energy sensitive resist material is exposed to a gaseous etchant mixture that contains HF vapor. The etchant mixture is produced by combining three vapor streams: the HF; a gas that initiates the etching process; and a carrier gas. The initiator gas is one that initiates the reaction of the HF vapor with the Si—O bonds in the resist. The initiator gas is a small amount of a polar reagent which renders the Si—O bond more susceptible to attack by the HF vapor. Examples of suitable polar reagents include water vapor, and low molecular weight alcohols such as methanol and ethanol. The more polar the initiator gas, the faster the etch rate. The carrier gas is simply a non-reactive gas such as nitrogen or argon, for example, in which the reactive components of the gaseous stream are carried and dispersed.

Silicon polymers deposited from the gas phase such as those represented by the formula $R_xSiH_y$, with R being an organic moiety and with $0.2<x<1.5$ and $0.2<y<1.5$, have been found to exhibit quite advantageous properties for lithographic processes. Particularly advantageous polymers are prepared by discharge deposition from the vapor phase using, for example, $RSiH_3$ precursors, e.g., methylsilane and ethylsilane, to give polymers having substantial Si—$(Si)_n$—Si bonded networks.

Materials produced by plasma deposition are typically insoluble (solubility less than 20% of original weight in toluene) but, nevertheless, lend themselves to patterning and development without use of liquid processing, and, if desired, are suitable for a cluster or highly integrated processing environment. These polymers are capable of photooxidative patterning with sensitivities as good as 15 $mJcm^{-2}$ (at 248 nm), allow resolution of dimensions at least as small as 0.25 μm, and, for many processes, allow pattern development and subsequent dry etching of the underlying substrate in a single reactive ion etch sequence. Compositionally similar materials prepared by reductive condensation processes in the liquid phase from an $RSi\ HX_2$ (X=halogen) precursor, although not as advantageous, also offer desirable properties.

These polymers are believed to contain primarily silylene (RSiH) segments and silyne (RSi) branch points (R exemplified by alkyl, aryl, alkyl aryl, and/or H), are sensitive to light in the ultraviolet and deep ultraviolet in the presence of an oxidant, e.g. oxygen, as well as to particle radiation such as electron beam radiation in vacuum or in the presence of an oxidant. Irradiation of the materials in the presence of oxygen with energy such as in the ultraviolet, e.g., 190 to 400 nm, causes formation of glassy, siloxane network materials in the irradiated regions. In the process of the present invention the oxidized regions are advantageously removed to develop the pattern using HF vapor development.

In one embodiment of the present invention, the films from precursors such as $MeSiH_3$ and $EtSiH_3$ are formed over an unpatterned gate stack, such as the one illustrated in FIG. 1. The gate stack illustrated in FIG. 1 is a layer of titanium nitride (TiN) 100 that is formed over a layer of polysilicon 120 that is formed over a silicon substrate 130 with a patterned layer of silicon dioxide 140. In this embodiment the film 150 is formed on the patterned gate stack and photo-oxidatively patterned as described above. After patterning, the remaining portion of the films are converted to oxide. After the patterned film is converted to oxide, the stack over which the film is formed is dry etched to transfer the pattern into the underlying layer of TiN 100 and polysilicon 120.

DETAILED DESCRIPTION

Figure 1:
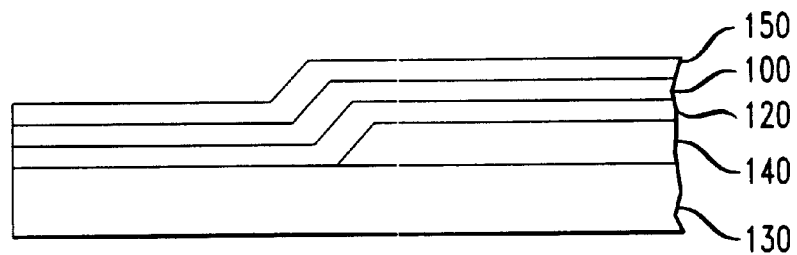
FIG. 1 is a cross-section of a device which is fabricated using the process of the present invention.

A class of photosensitive materials involved in the invention is represented by the formula:

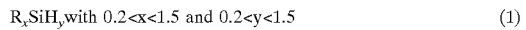

$$R_xSiH_y \text{ with } 0.2<x<1.5 \text{ and } 0.2<y<1.5 \qquad (1)$$

where R is either hydrogen or an organic substituent (small quantities of a non-organic R are not precluded). Suitable organic substituents include alkyls, such as lower alkyls (alkyls having 1 to 5 carbon atoms), aromatic moieties, such as phenyl, alkyl aryl moieties and other organic substituents such that the deposition precursors containing these substituents have a sufficient vapor pressure (or partial pressure when using a carrier gas) to allow useful deposition rates (deposition of at least 10 Å/min).

The particular organic substituent chosen depends on the ultimate properties desired for the silicon containing photosensitive composition. Typically, smaller substituents yield, upon photooxidation, material that exhibits a much higher etch rate in the HF vapor etchant relative to the unexposed material than materials having a larger organic substituent. This higher etch rate is attributed to the volatile by-products produced by materials with smaller substituents (e.g. methyl groups) during HF vapor etching. The larger the substituent, the lower the etch rate. For example, materials with ethyl substituent groups have a lower etch rate than materials with methyl substituents. Materials with aromatic substituents such as phenyl, while having lower etch selectivity between exposed and unexposed regions in the vapor etchants, generally have greater thermal and oxidative stability.

It is possible to synthesize and deposit the materials involved in the invention through a variety of techniques. For example, precursors represented by the formulae:

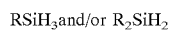

$$RSiH_3 \text{ and/or } R_2SiH_2$$

where R is as defined supra are subjected to a low energy discharge. (A combination of precursor gases is also useful.) It is also possible to add in small quantities other gases such as silane to influence properties such as the absorption characteristics or film density. For dry deposition, the discharge is typically excited by radiation in the range 500 KHz to 30 MHz. However, other discharges, such as D.C. discharges, are also suitable. Additionally, discharges such as microwave discharges generating reactive species in a region remote from the precursor and which subsequently react with the precursor are not precluded. Suitable energies depend, to an extent, on the precursor materials and processes, but generally discharges having unconventionally low energy densities in the range $2\times10^{-3}$ to 0.2 $Wcm^{-2}$ of substrate are employed. Generally, the discharge conditions are adjusted so that a faint but stable glow (in the pure precursor or carrier gas and precursor combination) is visually observable adjacent to the substrate in a darkened room. The exposure and processing characteristics of gas phase deposited films degrade somewhat upon exposure to oxidant or adventitious light. This instability is mitigated by using higher plasma energy densities or elevated substrate temperatures but lower exposure sensitivities result. To obtain films of highest sensitivity and achieve fastest deposition rates, it is preferable to maintain the substrate 5–30° C. below the ambient temperature of the chamber walls of the apparatus. In contrast, plasma depositions are normally done under conditions that heat the substrate above the ambient.

Vapors of liquid precursor materials are introduced into the region of the substrate generally through use of a carrier gas. For example, a carrier gas such as hydrogen is bubbled through the precursor material for such introduction. Generally, the partial pressure of the precursor is such as to result in a concentration of at least two mole percent of the carrier gas. Use of hydrogen as a carrier gas is advantageous since it promotes a stable discharge and yields more uniform films. Typically, flow rates of the carrier/precursor combination in the range of about 5 sccm to about 200 sccm per liter of reaction volume are employed. A control sample is employed to empirically establish precise flow rates, pressures, power levels, and deposition times to achieve the desired uniformity, absorption properties and photosensitivity for a given reactor geometry.

The discharge is generally struck using conventional apparatus well known to one skilled in the art. For example, a discharge is struck in the precursor/carrier combination in a parallel plate reactor is described in *Plasma Deposition, Treatment and. Etching of Polymers,* R. D'Agostino, Ed., Academic Press, New York, 1990, where the precursor is introduced through, for example, multiple openings in the upper powered electrode. Generally, to avoid deposition of particles it is advantageous to maintain pressures below 500 mTorr and to limit residence time of reactants in a plasma column. Deposition rates are generally in the range 50 to 500 Å/min. Film thicknesses are typically in the range 200 to 20,000 Å (preferably 500 to 5000 Å). Deposition is terminated simply by extinguishing the discharge.

In the process of the present invention, the energy sensitive silicon-containing materials, such as, but not limited to, the materials described above, are patterned by converting a portion of the resist into a glassy material by subjecting the resist to an oxidant such as molecular oxygen, in the presence of exposing radiation. Exposing radiation includes radiation such as vacuum ultraviolet, deep ultraviolet, and ultraviolet as well as particulate energy such as an electron beam. Exemplary wavelengths of exposing radiation include 193 nm, 248 nm, 310 nm, and 365 nm. When the wavelength of the exposing radiation is 193 nm, these energy sensitive silicon-containing materials are particularly advantageous because these materials bleach and oxidize sufficiently to allow more selective positive tone development.

It is desirable to prevent contact of the resist films with air until between 1 minute and an hour before exposure. Excessive pre-exposure contact with oxidants reduces pattern development selectivity while a brief pre-exposure contact insures sufficient availability of oxidant. The use of endpoint detection applied to plasma development allows relatively larger latitudes in pre and post-exposure contact with oxidant. Total pre and post-exposure contact with oxidant should generally be less than 1 hour but less contact generally is desirable. Oxidants such as oxygen containing gases including air at ambient pressure are useful. It is contemplated that deposition at low power densities and at temperatures around room temperature produces films of low density with high permeability to, and reactivity with, oxygen. Such films contain extensive Si—Si bonding and reactive SiH moieties that together yield efficient photooxidation processes. Through introduction of oxidant in the presence of radiation, materials containing Si—O—Si species and Si—OH species are obtained in the irradiated area. (It is possible to irradiate in a pattern or alternatively to irradiate the entire material to form an organosilicon oxide glass.) Additionally, for some applications it is advantageous to deposit an underlying layer of amorphous silicon since this underlying layer is highly absorbing for typical exposing radiation and acts as an antireflection coating. A chlorine-based plasma such as $Cl_2$ is used to transfer the pattern through the underlying amorphous silicon. Organic plasma polymerized antireflective coatings are also useful. Such coatings are obtained by striking a plasma in an organic gas such as a volatile unsaturated hydrocarbon gas e.g., cycloheptatriene. Use of this plasma deposited antireflection coating allows an all dry process and provides a better etch stop for the development of the overlying resist. The use of conventional organic antireflection coatings, however, is not precluded. An additional advantage of gas phase deposition of radiation sensitive layers is the avoidance of solvent attack on the underlying layer, which can be a readily soluble material.

The pattern formed by irradiation is developed by subjecting the film to an HF vapor that preferentially removes the exposed region at a rate substantially, e.g. at least 1.5 times, faster than it removes the unexposed regions. A developer that removes the exposed region yields a positive image.

Deposition, as described above, for thicknesses greater than 0.25 $\mu$m tends to induce delamination during positive image development. Thus, if greater thicknesses are desired, the deposition process should be advantageously modified.

For some applications it is also possible to include additional step(s) between the development of the patterned resist and the subsequent pattern transfer to the underlayer. Such additional steps are exemplified by a) a blanket deep UV exposure in air of the developed resist mask, b) subjecting the developed resist mask to a brief $O_2$-plasma treatment or c) a combination of a) and b), to increase the overall oxygen content of the resist mask beyond that achieved in the initial photooxidative patterning step with a concomitant improved/increased selectivity during the RIE pattern transfer step.

The developed resist is used for further processing. e.g., as an etch mask for plasma etching of the underlying material. Etching processes are well-known and described in compendia such as R. D'Agostino supra. Generally, the higher the silicon weight percentage in the material, the greater the selectivity in the pattern transfer step into the underlying organic layer. To increase silicon content it is advantageous to use smaller substituents, such as ethyl and methyl.

The following examples are illustrative of methods for depositing silicon containing photosensitive materials and for exposing and processing such materials.

EXAMPLE 1

Figure 2:
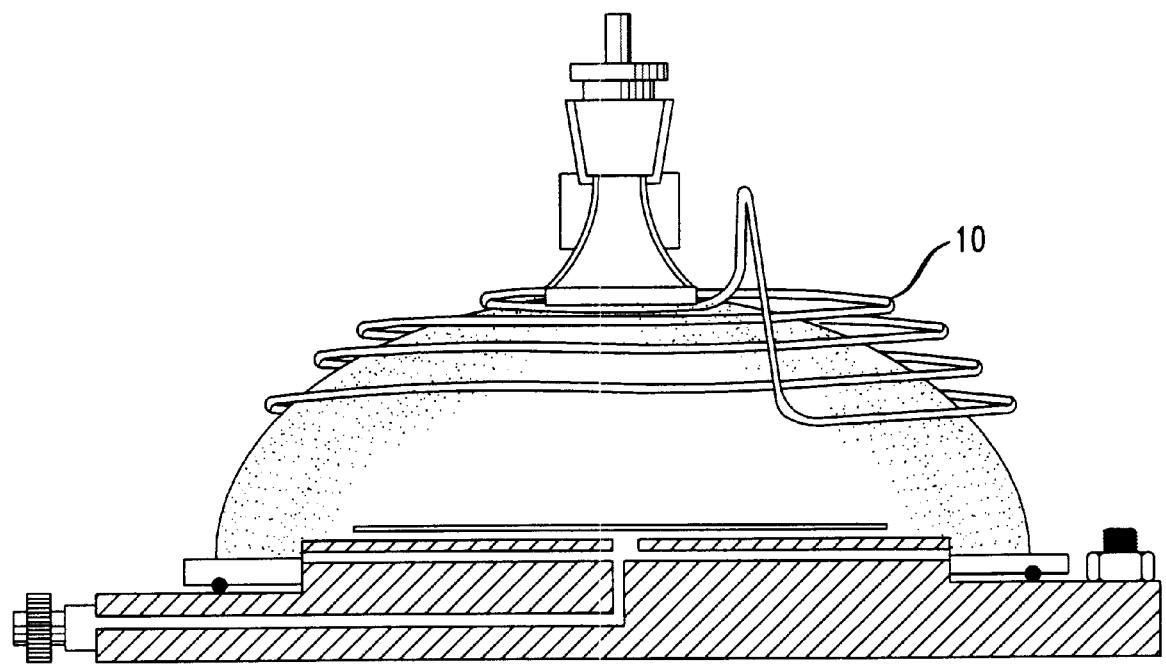
FIG. 2 is illustrative of apparatuses useful in practicing this invention.

A simple apparatus useful for the dry deposition of [RSiH] hydrogenated organosilicon films is illustrated in FIG. 2. The apparatus was constructed from a 10"×¾" thick aluminum baseplate with a central 4" diameter platform elevated ¼" (the remainder of an initially 1" thick plate was removed by machining) tapped to allow attachment to a vacuum pump and pressure gauge. Into the top elevated portion of the platform were cut 8 radial channels, ⅛" thick and ⅛" deep, symmetrically distributed every 45° around its circumference, and joining the central ⅜ vacuum opening. A shallow glass bell jar enclosure with an ID of approximately 7" and height of about 4" was placed over the base and formed a vacuum tight seal with an O-ring. Coiled around the enclosure and terminating about 2" from the baseplate was a copper coil 10 consisting of about 4 turns of a ⅛" ID copper tube, following loosely the contour of the vessel but ending 2" short of the metal baseplate at its nearest point. The apparatus was placed in an inert atmosphere (argon) glovebox. A plasma was struck in the apparatus by connecting the copper coil to a high frequency spark generator operating at 4.5 MHz (Electro-Technique Products Model BD 20). All Examples were conducted at pressures ranging from 400 to 600 mTorr as read from a thermocouple vacuum gauge inserted into the aluminum base plate.

A flat, polished silicon substrate of 5 inch diameter, having the (100) crystallographic plane as its major surface, was placed on the platform 20, and the system was evacuated to a base pressure below 40 mTorr. (Quartz substrates were also used to measure the optical properties of films.) As indicated below in Table 1, depositions were conducted using, individually, a number of $RSiH_3$ precursors or individually dimethylsilane and tetramethylsilane, each of which was introduced through the glass diffuser inlet at the top of the enclosure. The voltage was adjusted to create a weak, stable discharge visually perceivable in a darkened room, confined to, and completely filling the enclosure above the wafer. The optical densities of the resulting films for the precursors employed are shown in Table 1 below.

TABLE 1

Precursors and Optical Densities of Resulting Films:

| Precursor | $Absorbance_{248\ nm}$ / 1000Å ± 0.1 |
|---|---|
| $CH_3SiH_3$ methylsilane | 0.60 |
| $C_2H_5SiH_3$ ethylsilane | 0.70 |
| $n\text{-}C_6H_{13}SiH_3$ n-hexylsilane | 0.20 |
| $C_6H_5SiH_3$ phenylsilane | 0.35 |
| $(CH_3)_2SiH_2$ dimethylsilane | 0.30 |

Flow rates of undiluted gaseous precursor averaged between 8 and 12 sccm (based on the measured consumption of the precursors after extended deposition runs) with the vacuum valve completely open. Flow was adjusted by using a metering valve on the inlet line. (Silane oligomers condense in vacuum pump oil and can give rise to explosive mixtures, particularly if moisture is present. Careful precautions must be taken to avoid this situation.) For liquid precursors, the hydrogen gas (typically at about 2 psig) was redirected through the vessel containing the precursor. The precursor gas was delivered until a film thickness of 1000±100 Å was achieved. The resulting film was protected from light and air by storage in a glovebox under flowing nitrogen until 10 minutes before lithographic exposure. It was exposed to the ambient under clean room illumination and patterned (in a GCA 2000 KrF excimer laser stepper system operating at 248 nm). The lithographic exposure was done at doses varying from 50 to 290 $mJcm^{-2}$ by steps of 10 $mJcm^{-2}$. Oxidation was generally accompanied by a roughly 100 Å (about 10%) increase in film thickness. Both development and pattern transfer into an underlying thick layer of hard-baked Hunt Photo Resist-206 were accomplished using a helical resonator reactive ion etching (RIE) system without removing the sample from the etch chamber. Films (about 1000 Å) were deposited from ethylsilane on top of 8000 Å of hard-baked photoresist. Exposure was accomplished as described above.

EXAMPLE 2

Low energy rf plasma assisted deposition of photosensitive silicon polymers, using the silane precursors of Example 1, was carried out in a PlasmaThermShuttleLock Series 700 plasma etch reactor operating at 13.56 MHz and equipped with an 11" diameter wafer tray which accommodated three 5" diameter wafers.

A silicon polymer film using ethylsilane as the precursor was deposited simultaneously on (A) a 5" Si (100) substrate, (B) a 5" Si (100) wafer spin coated previously with a 1.0 μm thick hard baked Shipley resist 1811 and (C) a 5" Si (100) wafer spin coated with 2500 Å of a deep-UV antireflection coating (ARC), Brewer DUV-07, at ambient temperature over a 15 min period, at a nominal flow rate of 50 sccm, 200±10 mTorr pressure, 9 (±1 W incident and 0–1 W reflected rf power (power density about 15 $mWcm^{-2}$). A faint glow was visible during the course of the deposition. The refractive index and the thickness of the polymer film on the silicon substrate, as obtained from a nine-point measurement using a Nanometrics Nanoscope, averaged 1.79±0.03 and 1550±50Å, respectively. The average film thickness value measured by a Dektak 3030 profilometer was in agreement with that obtained from the Nanoscope measurements.

A 4400±100 Å thick film also deposited from ethylsilane precursor was similarly deposited over 40 minutes on a 5" Si (100) substrate with a previously deposited 5000 Å polysilicon layer on 1000 Å $SiO_2$ (D).

The deposited films were removed from the reactor and stored under vacuum and protected from exposure to ambient light until a few minutes prior to patterning. Each of the three Test Samples A–C was patterned in air as described in Example 1 on a GCA Model 2000 Deep UV Stepper, operating at 248 nm, using a resolution mask with exposures in the 50 to 290 $mJcm^{-2}$ range (starting at 50 and increasing by 10 mJ increments; 5×5 matrix) at best focus. An approximately 150 Å thickness increase resulting from the oxidation was measured in the exposed regions (about 100 $mJcm^{-2}$). Test Sample D was patterned using the same exposure equipment and resolution mask with exposures ranging from 10 to 250 $mJcm^{-2}$ (starting at 10 and increasing by 10 mJ increments; 5×5 matrix). In each case the latent images were visible through the entire exposure range.

EXAMPLE 3

A procedure for positive tone bilevel processing using plasma polymerized methylsilane imaging layers deposited under conditions selected to increase stability to handling in air is described below. Depositions were performed using the Plasma Therm Model 700 deposition/etch system operating in etch mode, i.e., with the wafer placed on the lower RF powered electrode with the top showerhead electrode grounded. Films were deposited at RF powers of 20 W, with methylsilane flow rates of 50 sccm and pressure controlled at 300 mTorr. Under these conditions, five-minute depositions onto single wafers centered on the lower electrode gave films with an initial thickness of 1400 Å and refractive index of 1.72.

Wafers used for bilevel patterning were precoated with 0.80 μm of Shipley 1809 resin baked at 250° C. for 2 minutes, after which a five-minute deposition of plasma polymerized methylsilane was performed as described above. Wafers were exposed using a GCA 248 nm Deep UV stepper with exposure doses ranging between 10 and 200 mJ/cm$^2$ (in 10 mJ/cm$^2$ increments), either through a clear quartz mask blank or resolution test mask. Positive tone development was performed by submerging wafers in a room temperature bath of 7:1 NH$_4$F/HF buffered aqueous oxide etch solution for 5 minutes, after which films were rinsed with dionized water and spun dry under a purge of dry nitrogen at 50° C.

Figure 3:
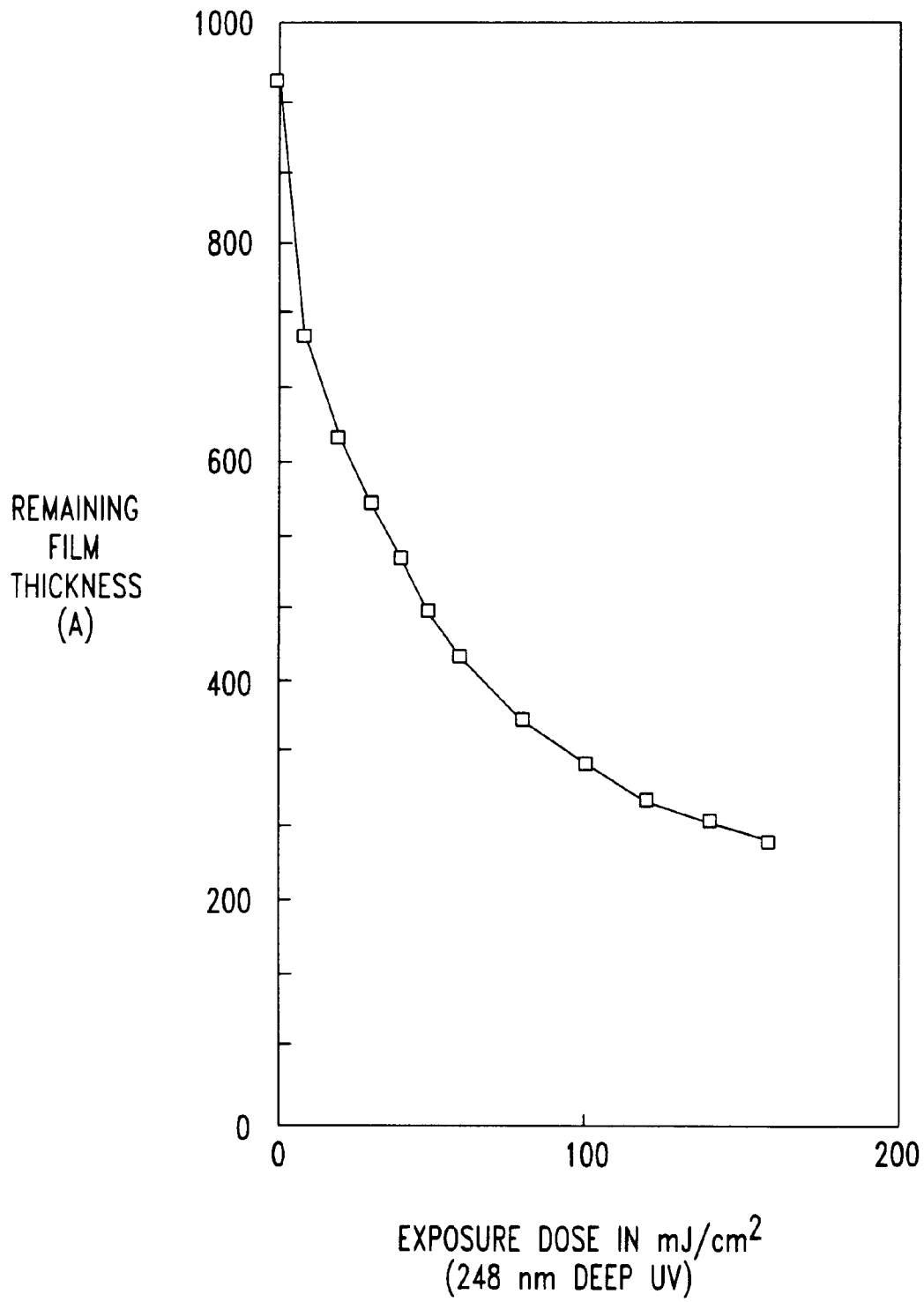
FIG. 3 illustrates properties associated with photosensitive material involved in the invention.
Figure 4:
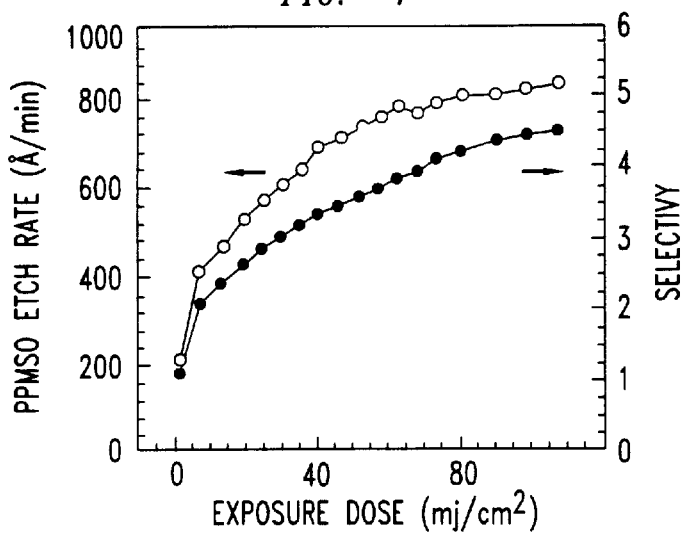
FIG. 4 is a graph illustrating the effect of exposure dose on both the HF vapor etch rate of the oxygen-containing resist material (plasma-polymerized methylsilane (PPMS); the oxygen-containing resist is designated as PPMSO) and the etch selectivity of the exposed resist material in the HF vapor.

Films were then blanket exposed to deep UV light in air for one minute under a low pressure mercury vapor lamp (using an apparatus intended for UV-ozone resist stripping) at room temperature, which converted material remaining in both exposed and unexposed regions into a completely photooxidized form with a refractive index ca. 1.45. A plot of the film thickness in exposed areas as a function of exposure dose is given in FIG. 3. Development of bilevel patterns was performed using a two step timed etch procedure. The first step (essentially a plasma descum step) employed a mixture of SF$_6$ (26 sccm) and 6 sccm O$_2$ in a Lucas Labs Helicon etching tool operating at 2 mTorr with 2500 W source power and 25 W chuck bias. Based on etch rate measurements on identically treated, blanket UV exposed films on bare silicon, an etch time of 40 seconds was chosen to effect the uniform removal of 400 Å of material, an amount sufficient to uncover the underlying organic layer in exposed regions of the patterned substrates. Pattern transfer through the underlying organic layer was performed subsequently in the same chamber using 50 sccm pure oxygen at 2.0 mTorr at 2500 W source power with a chuck power of 100 W and etch time of 35 seconds. Top-down line width measurements on developed bilevel patterns were performed on a Hitachi S-6000 (0.8 keV) scanning electron microscope. Exposure dose latitudes providing features within 10% of coded dimensions for nested 0.25 line and space features were between 130 and 160 mJ/cm$^2$, with even wider latitudes and good linearity observed for larger sized features.

EXAMPLE 4

A silicon polymer film was formed on a 125 mm-diameter silicon wafer that was lightly doped with p-type dopant. A parallel plate plasma tool (PlasmaTherm SL-700 obtained from the PlasmaTherm Corp.) operated at a frequency of 13.56 MHz was used to form the silicon-containing polymer on the silicon substrate. The film was formed by flowing methylsilane into the chamber in which the silicon wafer was introduced at a flow rate of 50 sccm while the pressure in the chamber was maintained at 400 mTorr. The plasma power was maintained at 20 Watts while the substrate temperature was kept at room temperature. The film was deposited at a rate of about 650 Å/min. The resulting thickness of the plasma-polymerized methylsilane (PPMS) film was about 1000 Å to about 2000 Å. The film was patternwise exposed to radiation in a lithographic exposure apparatus (GCA deep UV stepper with a 248 nm KrF excimer laser source). The dose was varied in the range from 10 mJ/cm$^2$ to 100 mJ/cm$^2$.

The exposed wafer was then placed in a vapor phase processing vacuum chamber (Primaxx Tool obtained from Submicron Systems of Allentown, Pa.). Hydrogen fluoride vapor, methanol and nitrogen were introduced into the chamber at respective flow rates of 300 sccm, 200 sccm, and 400 sccm. These gases were combined in a manifold before they were introduced into the chamber. The methanol initiated the etching process. The chamber pressure was maintained at 200 Torr during, the development process. The chamber was maintained at ambient temperature. The film thickness before and after the etching process was monitored using a Rudolph ellipsometer.

Figure 5:
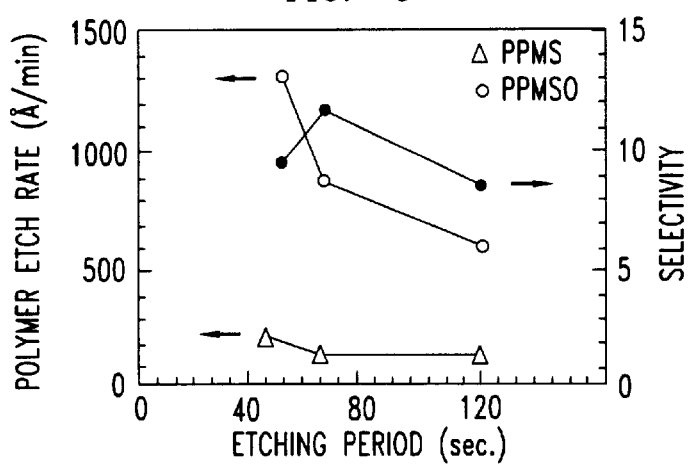
FIG. 5 compares the etch rate of the exposed resist material and the unexposed resist material in HF vapor throughout the etch period and illustrates the etch selectivity of the exposed resist material in the HF vapor etchant throughout the etch period.

The effect of the exposure dose on the etch rate of PPMSO (since oxygen is incorporated into PPMS when it is exposed to 248 nm radiation in the presence of oxygen, exposed PPMS is referred to herein as PPMSO) was observed. As illustrated in FIG. 5, the PPMSO etch rate increased significantly when the exposure dose increased from zero to about 80 mJ/cm$^2$. The etch selectivity (i.e., the ratio of the etch rate of the PPMSO to the etch rate of the PPMS) also increased significantly when the exposure dose increased from zero to about 80 mJ/cm$^2$. Because increased exposure dose translates to increased exposure time, it is advantageous to keep the exposure dose low, but still obtain a desirable etching selectivity between the exposed portion and the unexposed portion of the energy sensitive resist material. FIG. 5 demonstrates that an exposure dose of about 40 mJ/cm$^2$ to about 60 mJ/cm$^2$ provides this advantage.

In the process of the present invention when using the previously described Primaxx Development Tool, the flow rate of HF vapor stream is about 10 to about 1000 sccm, the flow rate of the initiator gas is about 10 to 1000 sccm, and the flow rate of the carrier gas is about 10 to about 5000 sccm. The total flow rate of the three streams combined is about 100 sccm to about 7000 sccm. It is advantageous if the ratio of the HF flow rate to the initiator gas flow rate is about 3:2 to about 2:1 and the ratio of the inert carrier gas to the HF flow rate is about 4:3 to about 2:1. It is advantageous if the HF vapor etch takes place at a pressure of about 50 Torr to about 760 Torr and a temperature of about 10° C. to about 200° C. In one embodiment the HF vapor flow rate is 300 sccm, the methanol flow rate is 200 sccm, and the nitrogen flow rate is 400 sccm with a chamber pressure of 200 Torr and a temperature of 26° C.

EXAMPLE 5

PPMS films (having a thickness of about 2000 Å) were formed over the polysilicon layer in the manner described in the previous example. The films were then patternwise exposed to radiation using the deep UV exposure apparatus described in the previous example. The wavelength of the exposing radiation was about 248 nm and the dose was 35 mJ/cm$^2$. The pattern was developed using hydrogen fluoride vapor as described in the previous example. After the pattern was developed, the previously unexposed PPMS was exposed to UV light at a wavelength of 248 nm in the presence of oxygen to convert the PPMS to PPMSO. After development, the thickness of the PPMS film was about 1200 Å.

Figure 6:
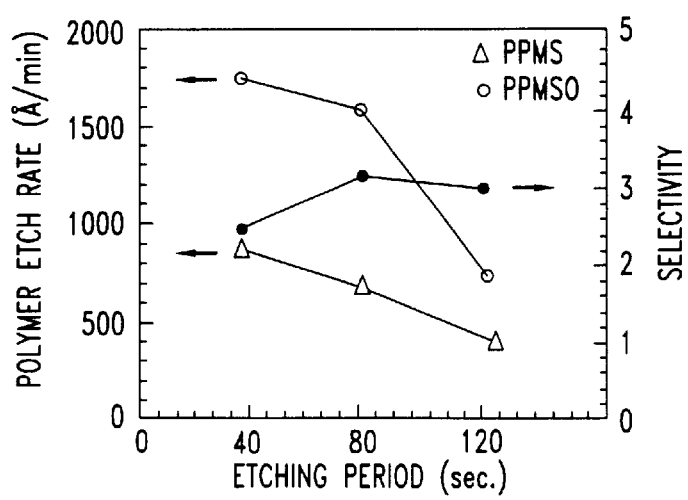
FIG. 6 compares the etch rate of the exposed resist material and the unexposed resist material in HF vapor throughout the etch period and illustrates the etch selectivity of the exposed resist material in the HF vapor etchant throughout the etch period for a resist material that was exposed to oxygen for an hour after the resist was exposed to radiation before commencing development of the pattern in the resist.

Referring to FIG. 6, the etch rate of the exposed PPMS was compared with the etch rate of the unexposed PPMS. The etch rate of the PPMS was observed to be about 120

Å/min while the etch rate for the PPMSO was observed to vary from about 1200 Å/min to about 500 Å/min over the course of the etch. Therefore, the etch rate of the PPMSO is much greater than the etch rate of PPMS in the hydrogen fluoride vapor over the course of the etching period.

FIG. 6 also demonstrates that the etching selectivity is at least seven or more over the etching period. Etching selectivity is defined as the ratio of the PPMSO etch rate to the PPMS etch rate. The etch selectivity also varies over the etching period, and was observed to be as high as ten at about fifty seconds into the etching period.

The effect of the amount of time that the resist material was exposed to oxygen during the exposure step was also evaluated. As previously noted, oxygen is incorporated into the PPMS. When the PPMS is exposed to ultraviolet radiation in the presence of oxygen, oxygen is incorporated into the exposed resist at a much faster rate than it is incorporated into the unexposed resist. Since oxygen must diffuse through the thickness of the PPMS, the top portions of the exposed resist convert to PPMSO before the bottom portions do. Although for a longer exposure time a greater amount of oxygen is incorporated into the resist, after a certain amount of time, little additional improvement in etch selectivity was observed.

A resist film was formed and exposed as previously described. However, the exposed film was held in ambient clean room air for about an hour after the resist was exposed to radiation before being subjected to a hydrogen fluoride etch as previously described. A comparison of FIG. 5 with FIG. 6 illustrates that the etch rates of the PPMSO and the PPMS increased with increased exposure to oxygen. However, the increase in etch rate was higher for the PPMS relative to the increase in PPMSO etch rate. As a result, the etch selectivity between the exposed portion and the unexposed portion of the energy sensitive resist material decreased as a result of the increased exposure to oxygen. Because of the significant decrease in selectivity that results from increased exposure to oxygen, it is advantageous if the hydrogen fluoride vapor etch commences within an hour after the resist is exposed to radiation.

It is also advantageous if, after the PPMS film is formed on the substrate, the PPMS is retained under conditions that suppress the conversion from PPMS to PPMSO. Such conversion will take place to a limited extent if the resist is exposed to visible light in the presence of oxygen because the PPMS film has an absorption tail that extends into the visible spectrum. Therefore, it is advantageous if the resist film is stored in a inert atmosphere, e.g. nitrogen, and is not exposed to either UV radiation or visible light until the commencement of patternwise exposure to radiation.

EXAMPLE 6

PPMS films were formed on a substrate as described in the above Example 4. One of the films had a thickness of 1100 Å and one of the films had a thickness of 1900 Å. The films were patternwise exposed to radiation and developed using a hydrogen fluoride vapor etch using the conditions described in the previous Example 5. The etch selectivity between the exposed resist and the unexposed resist was measured for the two films. The selectivity of the thinner film was observed to be greater. Specifically, the etch selectivity of the 1100 Å-thick film was 4.5 while the selectivity of the 1900 Å-thick film was 3.2. As noted above, since etch rates and selectivity are affected by the degree to which oxygen penetrates into the film, (and the thinner the film, the more quickly it is penetrated by oxygen) the thinner the film, the greater its selectivity.

The effect of the chamber pressure during the hydrogen fluoride vapor etch was also observed. Specifically, the etch selectivity of two identical films was determined during the etch. The chamber pressure (during one of the etches was 100 Torr and the chamber pressure during the other etch was 200 Torr. The etch selectivity was three at the lower chamber pressure and 2.8 at the higher pressure. Although the inventors do not wish to be held to a particular theory, the inventors believe that the relationship between chamber pressure and etch selectivity is more a function of the development tool than the process.

We claim:

1. A process for fabricating a device comprising the steps of: forming a layer of radiation sensitive material on a substrate, the material comprises a composition with a plurality of units represented by the formula:

$$[R_x SiH_y]$$

where $0.2<x<1.5$, $0.2<y<1.5$ and R is hydrogen or an organic substituent; exposing the radiation sensitive material to patterned radiation in the presence of oxygen, wherein the radiation sensitive material is exposed to oxygen for at least one minute during the time period beginning with the commencement of exposure and ending with the commencement of development, thereby introducing a first region exposed to radiation and a second region unexposed to radiation in the layer of radiation sensitive material, the first and second regions defining an image of the pattern in the layer of radiation sensitive material and developing the pattern using hydrogen fluoride vapor etchant comprising hydrogen fluoride vapor wherein the radiation sensitive material selectively incorporates oxygen to a significantly greater extent in the exposed radiation sensitive material than in the unexposed radiation sensitive material during the exposure step.

2. The process of claim 1 wherein the hydrogen fluoride vapor etchant comprises hydrogen fluoride vapor, an initiator gas, and a carrier gas wherein the flow rate of the hydrogen fluoride vapor etchant is about 10 to about 7000 sccm and wherein the flow rate of the hydrogen fluoride vapor is about 10 sccm to about 1000 sccm the flow rate of the initiator gas is about 10 sccm to about 1000 sccm, and the flow rate of the carrier gas is about 10 sccm to about 5000.

3. The process of claim 2 wherein the initiator gas is a vapor containing a polar species.

4. The process of claim 3 wherein the initiator gas is selected from the group consisting of water vapor, methanol vapor and ethanol vapor.

5. The process of claim 2 wherein the carrier gas does not react with the HF vapor or the initiator gas.

6. The process of claim 5 wherein the carrier gas is selected from the group consisting of nitrogen, air and argon.

7. The process of claim 2 wherein the ratio of the hydrogen fluoride vapor flow rate to the initiator gas flow rate is about 3:2 to about 2:1.

8. The process of claim 7 wherein the ratio of the carrier gas flow rate to the HF flow rate is about 4:3 to about 2:1.

9. The process of claim 8 wherein the pressure at which the pattern is developed is about 50 Torr to about 760 Torr.

10. The process of claim 9 wherein the temperature at which the pattern is developed is about 10° C. to about 200° C.

11. The process of claim 1 wherein the radiation comprises ultraviolet or deep ultraviolet radiation.

12. The process of claim 1 wherein the organic substituent comprises an alkyl, aryl, or alkyl aryl substituent.

* * * * *